United States Patent [19]

Dickens

[11] Patent Number: 5,216,621
[45] Date of Patent: Jun. 1, 1993

[54] LINE DISTURBANCE MONITOR AND RECORDER SYSTEM

[75] Inventor: Richard T. Dickens, Iowa City, Iowa

[73] Assignee: Mehta Tech. Inc., Eldridge, Iowa

[21] Appl. No.: 662,238

[22] Filed: Feb. 28, 1991

[51] Int. Cl.$^5$ .................... G06F 15/56; G06F 12/02; G06F 12/16

[52] U.S. Cl. .................. 364/483; 324/500; 364/492

[58] Field of Search ............ 364/481, 483, 492, 482; 324/86; 235/156; 361/76, 80; 307/87; 322/19; 395/425, 600

[56] References Cited

U.S. PATENT DOCUMENTS

| | | | |
|---|---|---|---|
| 3,669,441 | 10/1972 | Linders | 324/86 |
| 4,025,772 | 5/1977 | Constant | 235/156 |
| 4,148,087 | 4/1979 | Phadke | 361/80 |
| 4,249,088 | 2/1981 | Kleba et al. | 307/87 |
| 4,278,937 | 7/1981 | Immler | 324/86 |
| 4,313,169 | 1/1982 | Takagi et al. | 364/492 |
| 4,447,843 | 5/1984 | Massey | 361/76 |
| 4,450,497 | 5/1984 | Bignell | 361/82 |
| 4,455,612 | 6/1984 | Girgis et al. | 364/483 |
| 4,461,986 | 7/1984 | Maynard et al. | 318/778 |
| 4,484,290 | 11/1984 | Bagnall et al. | 364/483 |
| 4,535,409 | 8/1985 | Jindrick et al. | 364/492 X |
| 4,547,726 | 10/1985 | Premerlani | 324/78 |
| 4,570,231 | 2/1986 | Bunch | 364/492 |
| 4,617,636 | 10/1986 | Johns et al. | 364/482 |
| 4,641,088 | 2/1987 | Jacobsson | 324/86 |
| 4,669,024 | 5/1987 | Stacey | 361/85 |
| 4,680,706 | 7/1987 | Bray | 364/492 |
| 4,689,709 | 8/1987 | Isahaya | 361/80 |
| 4,701,689 | 10/1987 | Yuan et al. | 322/19 |
| 4,723,189 | 2/1988 | Larsen et al. | 361/76 |
| 4,812,995 | 3/1989 | Girgis et al. | 364/481 |

OTHER PUBLICATIONS

"A New Measurement Technique for Tracking Voltage Phasors, Local System Frequency, and Rate of Change of Frequency", EIII Paper No. 82, SM 444-8, A. G. Phadke et al.

"A Microcomputer Based Symmetrical Componenet Distance Relay", Phadke et al. for the American Power Service Corporation, New York.

"A Microcomputer Based Ultra-highspeed Distance Relay: Field Tests", IEEE Paper No. 80, SM 649-4, A. G. Phadke et al.

"Real-time Voltage-Phasor Measurements for Static State Estimation", IEEE vol. No. PAS-104, No. 11 Nov. 1983, J. S. Thorp, et al.

*Primary Examiner*—Kevin J. Teska
*Attorney, Agent, or Firm*—Woodard, Emhardt, Naughton, Moriarty & McNett

[57] ABSTRACT

A fault detection system for monitoring at least one operating parameter of an AC power transmission line includes current and/or voltage transducers connected to the transmission line for providing an analog signal representative of at least one time varying parameter of the AC power transmission. An analog-to-digital (A/D) converter samples the analog signal and produces digital sample words representing the signal. The digital sample words are provided by a data bus to a high speed DSP module which includes a number of fault trigger components for operating on the digital sample words to detect a disturbance. The DSP module generates a trigger signal when a disturbance is detected by one of the fault trigger components. The digital sample words are also provided to a DMA component, resident within a host CPU, which implements a memory allocation protocol to sequentially address a plurality of memory zones in a loop for sequential storage of the digital sample words in the discrete storage locations of the addressed memory zone. According to a fault condition memory allocation protocol, the DMA component removes at least one of the plurality of memory zones from the loop addressable by the DMA in response to receipt of a trigger signal. The removed memory zones include storage locations containing user-determined amounts of pre-fault, fault and post-fault digital sample words to fully define the AC abnormality. The DMA component continues to sequentially address the remaining ones of the plurality of memory zones as new digital sample words are received. Buffer memory zones are added to the sequential address loop for storage of the new digital sample words.

11 Claims, 2 Drawing Sheets

LINE DISTURBANCE MONITOR AND RECORDER SYSTEM

BACKGROUND OF THE INVENTION

The present invention relates to monitoring of disturbances in the operating parameters of power transmission lines. In particular, the invention concerns the detection and subsequent recording to data descriptive of such disturbances.

In the field of electrical power engineering, generating systems for producing electrical power are interconnected in a complex power grid by high voltage alternating current (AC) three-phase electric power transmission lines. Occasionally, a transmission line is faulted when, for example, a conductor wire breaks and falls to the ground or conductor wires short-circuit together. Other disturbances can occur at the source of the electrical power itself, such as variations in peak voltage or current, frequency changes. Early detection and characterization of a disturbance in an electrical power transmission system is essential to a quick resolution of the problem. Some disturbances can lead to blackouts of a faulted section, while other disturbances cause problems to a power customer who may depend upon receiving electrical power within prescribed operating parameters. It is understood that references to faults or disturbances are intended to encompass any type or nature of abnormality in AC signal or power transmission.

Consequently, disturbance detectors have been developed in which various operating parameters of a power line are compared with preset parameters to determine the character and amount of a deviation. Some detectors have been used with disturbance recorders in which analog representations of the parameters of interest are recorded and displayed.

More recent devices incorporate microprocessor technology to operate on digital representations of the AC power signals. One example is the line disturbance monitor shown in the patent to Bagnall el al., U.S. Pat. No. 4,484,290. Bagnall describes a monitor which receives analog signals from the transmission power line and converts the signals to a digital representation. The monitor includes storage means having a plurality of storage locations, of which a predetermined number are assigned to pre-disturbance operation to store sequentially generated words representative of the sampled AC signal. A remaining number of storage zones are assigned to post-disturbance operation to sequentially store sample words once an AC disturbance has been detected. In the Bagnall device, a disturbance means includes a processor arrangement which receives the AC converted data and compares this data to a number of values indicative of optimal AC operating parameters. Until a disturbance is detected, the pre-disturbance memory storage locations are sequentially overwritten. However, once the Bagnall line disturbance monitor detects a disturbance, the second group of memory locations is accessed for sequential storage of the post-disturbance data.

One difficulty with the Bagnall device is that it requires memory external to the CPU memory of the microprocessor used to perform many of the monitor's functions. Moreover, it does not provide means for storing pre-disturbance data, which data can be important in assessing the cause of a line disturbance. The presently known digital line disturbance devices suffer from these and other defects. For instance, many of these devices are incapable of storing new or old fault data when a second disturbance occurs. In addition, many digital disturbance monitors have no capability of determining the amount of pre- and post-fault data to be stored for subsequent output to various display devices.

Another problem with prior art line disturbance monitors is that the A/D converted signal data is used to perform comparisons for detecting line disturbances or faults. Fault detection by comparing signal data to optimum parameters restricts the type and characteristic of disturbances that can be detected by the monitor. An optimum method of performing the fault or disturbance triggering is to convert the incoming AC signal information to a phasor representation of the signal. This phasor representation can be used to perform a wide variety of fault calculations for comparison to known parameters. Phadke et al. have described a method of obtaining voltage phasors for use in detecting line disturbances which involves a recursive computation for the real and imaginary phasor components. This technique is discussed in "A New Measurement Technique for Tracking Voltage Phasors, Local System Frequency, and Rate of Change Frequency," IEEE Paper No. 82, SM 444-8, A. G. Phadke, J. S. Thorpe, and M. G. Adamiak (1982). In the Phadke et al. approach, a recursive equation is used to determine the phasor representation of the input signal based on digitized signal data. This phasor is subsequently used to calculate AC operating parameters such as phase angle, positive sequence voltage, and line synchronization parameters using a microprocessor-based routine.

Using phasor representations of the AC signal permits the digital line disturbance monitor to rapidly assess many types of fault conditions and line disturbances. However, there still remains a need for a line disturbance monitor that efficiently combines the phasor technique of AC signal representation with high-speed microprocessor technology to more rapidly assess triggering events. There is also a need for a monitoring system that permits user-controlled recording to pre-fault, fault and post-fault data.

SUMMARY OF THE INVENTION

A fault detection system for monitoring at least one operating parameter of an AC power transmission line includes means connectable to the transmission line for providing an analog signal representative of the time varying value of the operating parameter. An analog-to-digital (A/D) converter connected to said input means samples the analog signal and produces digital sample words representing the signal. Trigger means implemented within a high speed DSP is connected to receive the digital sample words from the A/D converter for operating on the digital sample words to detect a disturbance in the at least one operating parameter and for generating a trigger signal when a disturbance is detected. In one embodiment, the trigger means includes means for implementing recursive equations to compute the real and imaginary phasor components of the AC parameter. The phasor components can then be used to calculate various measures of power transmission performance according to known phasor equations, for instance symmetrical components, rate of change of voltage, line frequency and its rate of change, under-voltage and other quantities.

The disturbance monitor further comprises a host CPU having an internal memory for storing the digital sample words received from the A/D converter in a plurality of memory zones. A DMA module implements a memory allocation protocol for sequentially addressing the plurality of memory zones in a loop for sequential storage of the digital sample words. A fault memory protocol implemented by the DMA removes at least one of the plurality of storage zones from the loop addressable in response to receipt of a trigger signal. The removed memory zones contain user-determined amounts of pre-fault, fault and post-fault data. The memory protocol continues to sequentially address the remaining ones of the plurality of memory zones as new digital sample words are received by the storage means, and adds new memory zones to the storage loop to retain a full complement of memory zones.

It is one object of the invention to provide a digital disturbance monitor for AC transmission lines that incorporates high speed sampling and data processing. Another object is achieved by features of the monitor that implement a memory allocation protocol for writing data to internal memory.

A further object is to provide a disturbance monitor that is capable of storing significant user-determinable amounts of pre-fault, fault and post-fault data to fully define the transmission line disturbance and to avoid the loss of important fault information. Other objects as well as benefits of the invention will become apparent from the following written description and accompanying figures.

DESCRIPTION OF THE PREFERRED EMBODIMENT

Figure 1:
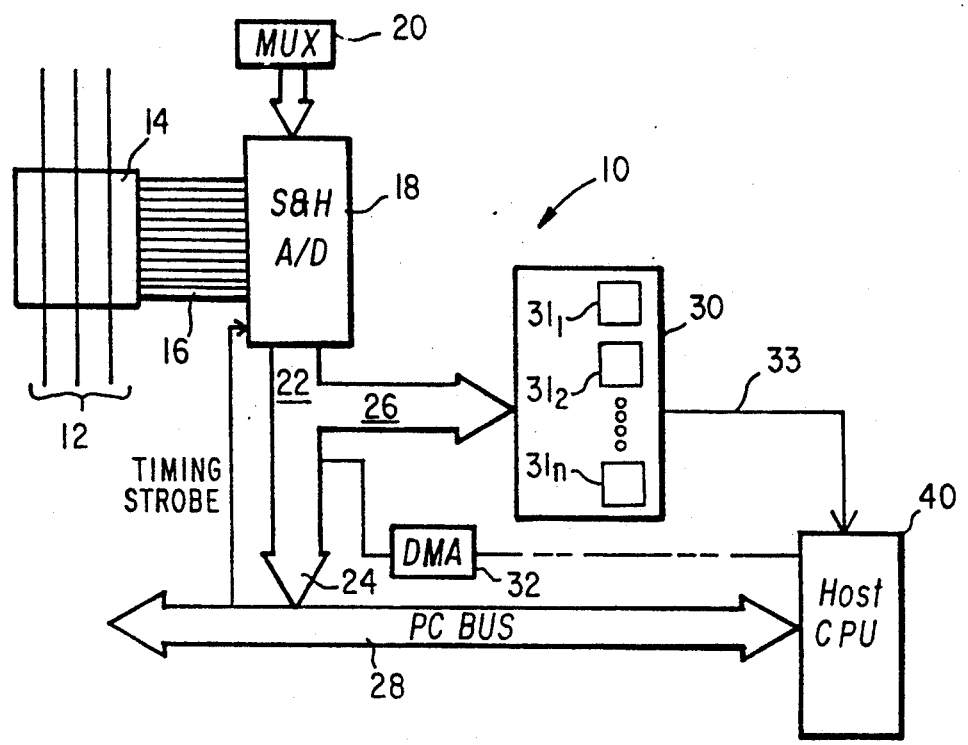
FIG. 1 is a schematic representation of the principal components of the disturbance monitor of the present invention.

For the purposes of promoting an understanding of the principles of the invention, reference will now be made to the embodiment illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

Referring to FIG. 1, a disturbance monitor 10 is shown for monitoring the operating parameters of power transmission lines 12. Input means 14, such as an arrangement of voltage or current transformers, produce analog representations of the time-varying values of the AC parameters through the power lines 12. In one specific embodiment, 16 input channels are provided through which the voltage and current representations from multiple power lines may pass. The analog signals are provided through input line 16 to an A/D converter 18. A multiplexer 20 is associated with the A/D converter to scan the inputs in sequence and assign specific multiplexer addresses to the incoming analog data for subsequent conversion. The output on line 22 from the A/D converter is provided simultaneously on line 24 to a PC bus 28, and on input/output line 26 to a digital signal processor (DSP) module 30 which includes a number of trigger processor components 31. Digital data on the PC bus 28 is provided to the host CPU 40 under the control of a DMA (direct memory access) component 32, which is part of the CPU architecture (as indicated by the phantom lines in FIG. 1). In one specific embodiment, the host CPU can be a NEC V20 or V40.

The processor module 30 receives the digital data from the A/D data converter 18 and performs specific operations using this data. The DMA component 32 is used to direct the digital data along PC bus 28 to an appropriate memory storage location within the host CPU 40. The trigger processor component 31 includes means for generating a phasor representation of the AC signal quantities, and for performing fault signature analysis on these phasor representations.

In one specific embodiment, the processor module 30 comprises a digital filter, supplemented by the 16-bit digital signal processor of Texas Instruments, No. TI320C25/C26. By appropriate programming, this processor module 30 receives the incoming digital data on lines 22 and 26 and operates on this data according to the following recursive equations for the real and imaginary components of the an AC quantity.

$$I_n = C_{ir}R_{n-1} + C_{ii}I_{n-1} + C_{id}D_i$$

$$R_n = C_{rr}R_{n-1} - C_{ri}I_{n-1} + C_{rd}D_i$$

In these equations, $D_i$ represents the incoming digital data. $R_{n-1}$ corresponds to the last value of the real component of the phasor representation of the AC quantity, while $I_{n-1}$ corresponds to the last imaginary component of that quantity. $R_n$ and $I_n$ correspond to the newly calculated current values of the AC signal phasor quantities. Thus, it is apparent that the foregoing equations are recursive equations to obtain values for the real and imaginary components of the AC signal at the current sample time. In one specific embodiment, a 3,000 sample/second/channel sample rate can be implemented using the digital filter described. Calculations according to the foregoing equations can be made within each sample time using a high-speed digital filter such as the TI32025/C26. Individual incoming data samples are stored within the DSP 30 until the calculations have been performed, after which only the latest result is maintained in the DSP.

The coefficients $C_{rr}$, $C_{ri}$, $C_{ir}$, $C_{ii}$, $C_{rd}$ and $C_{id}$ are calculated values predetermined to provide a sinusoidal representation. These coefficients can be dependent upon the power user or power utility and the characteristics of the AC signal being transmitted.

The recursion expressions above provide quantities for the real and imaginary components that can be implemented within the trigger processor components 31 of module 30 to perform a variety of phasor calculations. For instance, phasor algebra to determine rate of change of voltage ($\Delta v/\Delta t$), line frequency, rate of change of line frequency ($\Delta f/\Delta t$), under-voltage, rate of change of impedance, and rate of change of real or reactive power, are all within the ordinary skill of persons in the AC electric power generation and transmission art. More efficient phasor algorithms permit more rapid fault or disturbance calculations within the allotted sample time. It is important that these phasor operations occur during the sample time so that no AC signal data is missed for detection. Thus, processing and storage of the digital data representing the AC signal occurs at much higher speeds than disturbance monitors heretofore available. However, limited memory presents specific problems of memory allocation which are addressed by the present invention.

The processor module 30 can include a number of trigger processor components $31_1$–$31_n$ to perform the variety of phasor calculations and comparisons to expected AC operating parameters. Any one of these trigger processor components can generate an interrupt which is fed on interrupt line 33 to the host CPU 40 which controls the DMA component 32. The DMA component 32 appropriately directs the incoming digital data to specific memory storage locations as described below.

Figure 2:
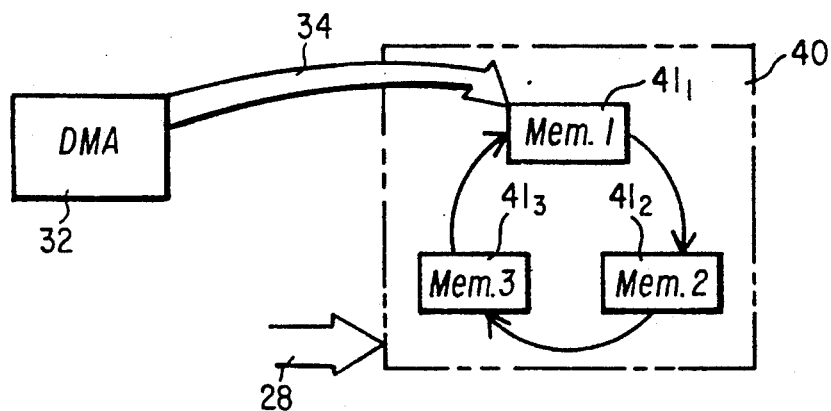
FIG. 2 is a detail schematic representation of the memory allocation protocol implemented by the present invention during normal AC signal transmission.

FIG. 2 represents the memory storage scheme implemented by the DMA component 32 during normal AC transmission-that is when no fault or disturbance has been detected. The processor module 30 provides trigger signals on line 33 only when a fault or disturbance has been detected. The DMA component 32 is a software module which implements a memory allocation protocol with means to point to one of a number of memory zones $41_1$–$41_3$ contained within the host CPU 40. Each of the memory zones $41_n$ contains several storage locations for sequential storage of data words received from the A/D converter 18. The host CPU 40 directs the DMA component 32 to implement a fault storage protocol when a trigger is received on line 33.

It is understood that the memory zones $41_1$–$41_3$ are partitions of the existing internal memory of the host CPU 40. The CPU 40 receives the digital data along PC bus 28, which data is directed to appropriate memory zones according to a pointer 34 generated by the DMA component 32. During no-fault normal operation, the DMA component 32 increments the pointer 34 to direct the incoming data to the memory zones $41_n$–$41_3$ in sequence. When one memory zone $41_1$ is full, the pointer 34 directs the data to the next sequential memory zone $41_2$ and so on for as many memory zones are allocated within the host CPU 40. The memory zones are continually overwritten until an interrupt from the processor module 30 is detected. The DMA component 32 maintains a map of memory zones within the CPU 40. A counter is also maintained which increments through the storage locations of each memory zone $41_1$–$41_3$.

Figure 3:
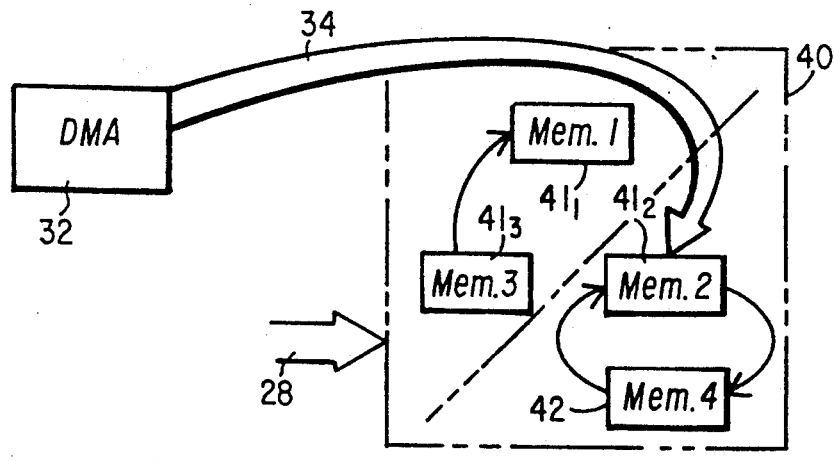
FIG. 3 is a detail schematic representation of the memory allocation protocol implemented by the present invention during a fault or disturbance in the AC signal transmission.

When a trigger signal is received from the processor module 30 (in response to calculations performed by the trigger components $31_1$–$31_n$), control within the DMA component 32 passes to a fault memory allocation routine. In this segment of operation, the current memory zone as well as the most recent memory zone are removed from the current memory map to, in effect, cut off these memory zones from the continuous sequential overwrite sequence. For instance, as shown in FIG. 3, if the fault event occurred while data was being passed to memory zone $41_1$, the DMA 32 would remove memory zone $41_1$, as well as memory zone $41_3$ containing the most recently stored data, from the memory map sequence.

To ensure that data continues to be received and stored, a supplemental memory 42 is added to the memory map sequence so that the pointer 34 can sequentially point to memory zone $41_2$ or supplemental memory 42 for storage in the respective storage locations of new digital data as it is received along the PC bus 28. Supplemental memory 42 is not a "buffer" memory as used in prior devices in which fault data is temporarily stored in a buffer and then transferred to permanent storage. Instead memory 42 is part of the permanent storage capability of the CPU 40 and becomes part of the sequentially accessed storage locations for new fault data.

The addition of the supplemental memory 42 permits the fault and pre-fault data stored in memory zones $41_a$ and $41_3$ to be downloaded for subsequent output or accessed by the CPU 40 for further processing without affecting the ability of the disturbance monitor 10 to receive and store data after the fault or disturbance has ended. It is understood that a second supplemental memory may also be added to form the same sequence of memory zones illustrated in FIG. 1. The fault and pre-fault memory zones are then returned to a "idle" condition until a subsequent fault condition has been detected requiring the addition of memory segments. If another fault is detected, the same fault memory allocation protocol is implemented with new memory locations.

The memory map of the DMA pointer module 32 maintains a supplemental memory zone list and a pointer memory zone list. The list of the supplemental memory zones are, in essence, inactive memory zones that are used to fulfill the role of the supplemental memory 42 shown in FIG. 3. The pointer list includes the addresses of the memory zone storage locations to which data can be fed during normal AC operating conditions.

The memory allocation sequence controlled by the digital memory pointer module 32 can also provide for serial memory segment allocation. In this instance, old memory zones are moved to the front of the serial memory location queue. When a fault condition is detected and a trigger is sent to the DMA component 32, a number of pre-fault memory zones can be removed from the serial memory zone list contained within the pointer module 32. With this approach, no supplemental memories are utilized since all available memory locations are identified in the memory segment list. Memory zones carrying fault-related data can be returned to the zone list once the data has been further processed.

Figure 4:
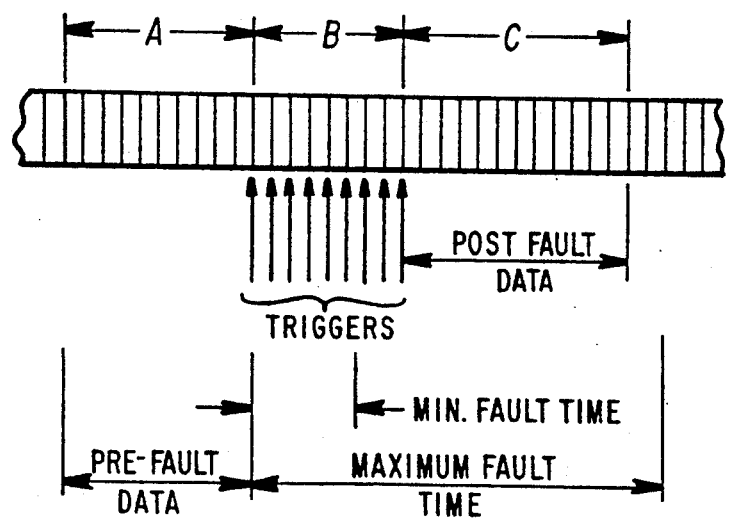
FIG. 4 is a schematic representation of AC signal data stored in memory and the pre-fault, fault and post-fault segments of the memory allocation.

In another aspect of the invention, the DMA pointer module 32 includes a second memory map which contains user-entered values to defined the range of fault data to be preserved to record the fault condition. As shown in FIG. 4, the time surrounding a fault event can be divided into three segments. The primary segment, segment B, corresponds to the occurrence of the fault trigger on line 33. According to the DMA protocol, the fault event continues as long as the triggers are received from the processor module 30 according to calculations by any one of the trigger processors 31. The segment B includes the number of binary data stored during the fault event.

Prior to the receipt of the first fault trigger is a pre-fault segment A. The period following the receipt of the last fault trigger is segment C corresponding to post-fault segment A and the post-fault segment C can be determined by the user of the disturbance monitor 10 of the present invention. Thus, a counter within DMA 32 can be used to count the number of pre-fault storage locations withdrawn from the memory map in the DMA component, as represented in FIG. 3. So long as trigger signals are being received by the DMA 32, the storage locations receiving the fault data (such as in memory $41_1$ in FIG. 3) will be allocated to the fault condition storage locations isolated from the memory sequence. The user may also enter the number of post-fault storage locations or data words that will be retained after the triggers cease. In addition, the user may enter minimum and maximum fault times, as shown in FIG. 4, corresponding to the least number and the greatest number of data that will be retained in the post-fault memory $41_1$. In this manner, the user can tailer the amount of data collected.

These user-entered parameters may also be tied to which of the trigger processor components $31_1-31_n$ generates the interrupt trigger to the DMA component 32. For instance, if a trigger processor corresponding to a transient event generates the interrupt, less pre- and post-fault data is generally required to fully define the fault event. However, if a line disturbance generates the interrupt, greater pre-fault and/or post-fault data may be required to permit the user to fully analyze the fault condition.

It can be seen that the disturbance monitor 10 of the present invention combines high-speed fault detection with comprehensive fault data storage. Since no external memory is required for this invention, no external communications are employed that could slow processing speed of the CPU 40 and processor module 30. The memory allocation scheme of this invention permits usage of the CPU internal memory and provides full memory capability for recording pre- and post-fault information. The flexibility of the monitor 10 can allow the customer to direct a download of any of the processor memories by generating an external interrupt on line 33.

While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected. For instance, although the invention has been described for use in monitoring AC electrical power transmission, it can be equally applicable to monitoring of other time variable quantities, such as component vibration signatures.

What is claimed is:

1. A fault detection system for monitoring at least one operating parameter of an AC power transmission line, comprising:

input means connectable to the transmission line for providing at least one analog signal representative of a time varying value of the at least one operating parameter;

an analog-to-digital (A/D) converter connected to said input means for sampling said at least one analog signal and producing digital sample words representing the signal;

trigger means connected to receive said digital sample words from said A/D converter for operating on said digital sample words to detect a disturbance in the at least one operating parameter and for generating a trigger signal when a disturbance is detected; and storage means for storing said digital sample words received from said A/D converter, said storage means including;

a plurality of memory zones for storing newly acquired data in storage locations within each memory zone;

memory pointer means for sequentially addressing said plurality of memory zones in a loop for sequential storage of said digital sample words in said storage locations of the addressed memory zone; and control means, connected to said trigger means, for removing at least one of said plurality of memory zones from said loop addressable by said memory pointer means, in response to receipt of said trigger signal;

wherein said memory pointer means continues to sequentially address the remaining ones of said plurality of memory zones in said loop as new digital sample words are received by said storage means.

2. The fault detection system of claim 1, wherein said trigger means includes:

means for generating phasor quantities representing the at least one operating parameter at the reception of said digital sample words; and means operating on said phasor quantities to detect deviations of said phasor quantities corresponding to said disturbance.

3. The fault detection system of claim 1, wherein said control means includes means for adding a new memory zone to said loop after said at least one of said plurality of memory zones has been removed in response to receipt of said trigger signal.

4. The fault detection system of claim 1, wherein said control means includes means for maintaining said memory pointer at said least one of said plurality of memory zones to receive a number of additional digital sample words after receipt of the last trigger signal from said trigger means, said number being determined by user-entered parameters.

5. The fault detection system of claim 1, wherein said control means further includes:

means for defining at least one memory zone corresponding to pre-disturbance sample words to be removed from said loop addressable by said memory pointer means.

6. The fault detection system of claim 1, wherein said control means further includes:

means for defining at least one memory zone corresponding to post-disturbance sample words to be removed from said loop addressable by said memory pointer means.

7. The fault detection system of claim 1, further comprising a CPU having an internal permanent memory, wherein said storage means is resident within said CPU and said plurality of memory zones are within said internal permanent memory.

8. The fault detection system of claim 1, wherein said trigger means is implemented in a high speed digital signal processor (DSP).

9. A method for fault detection and monitoring of at least one operating parameter of an AC power transmission line, comprising:

generating at least one analog signal representative of a time varying value of the at least one operating parameter;

converting the analog signal to digital sample words representing the signal;

providing the digital sample words simultaneously to a trigger processor means and to data storage means by way of a data bus;

operating on the digital sample words to detect a disturbance in the at least one operating parameter and for generating a trigger signal when a disturbance is detected;

storing the digital sample words into a plurality of memory zones in the data storage means according to a memory allocation protocol by which the plurality of memory zones are sequentially addressed in a loop for sequential storage of the digital sample words in the addressed memory zone;

removing at least one of the plurality of memory zones from the loop addressable by the data storage means, in response to receipt of a trigger signal, the at least one of the memory zones containing disturbance data; and thereafter storing newly acquired data words in the remaining ones of the plurality of memory zones sequentially addressed in a loop.

10. The method according to claim 9, further comprising the step of:

adding at least one new memory zone to the sequential memory loop in response to receipt of a trigger signal for sequential storage of new digital sample words.

11. The method according to claim 9, further comprising the step of:

receiving user input to identify the number of pre-fault or post-fault data words to be removed from the memory allocation loop in response to the receipt of the trigger signal; and in the removing step, removing only memory zones containing data words identified by the user input.

* * * * *